United States Patent [19]

Turner

[11] Patent Number: 5,017,809
[45] Date of Patent: May 21, 1991

[54] METHOD AND APPARATUS FOR PROGRAM VERIFICATION OF A FIELD PROGRAMMABLE LOGIC DEVICE

[75] Inventor: John E. Turner, Santa Cruz, Calif.

[73] Assignee: Advanced Micro Devices, Inc., Sunnyvale, Calif.

[21] Appl. No.: 425,306

[22] Filed: Oct. 23, 1989

[51] Int. Cl.$^5$ .................................... H03K 19/003
[52] U.S. Cl. .................................... 307/465; 307/443; 307/469; 371/22.1
[58] Field of Search ............... 307/465, 468, 469, 243, 307/443; 365/189.02, 189.08; 371/22.2, 25.1

[56] References Cited

U.S. PATENT DOCUMENTS

| | | | |
|---|---|---|---|
| 3,958,110 | 5/1976 | Hong et al. | 371/22.2 |
| 4,517,672 | 5/1985 | Pfleiderer et al. | 371/22.2 X |
| 4,625,311 | 11/1986 | Fitzpatrick et al. | 371/22.2 |
| 4,672,610 | 6/1987 | Salick | 371/22.2 X |
| 4,780,627 | 10/1988 | Illman | 307/468 X |
| 4,930,098 | 5/1990 | Allen | 307/465 X |

OTHER PUBLICATIONS

"Implementation of Diagnostics and Redundancy on a Programmable Logic Array", *IBM T.D.B.*, vol. 28, No. 6, Nov. 1985, pp. 2371–2373.

*Primary Examiner*—David Hudspeth
*Attorney, Agent, or Firm*—William J. Benman, Jr.

[57] ABSTRACT

A program verification circuit and technique adapted for use with a programmable logic array having at least one logic gate and first and second inputs thereto. A unique and novel operation is afforded by the present invention in that a method is provided of verifying the program of a field programmable logic array having a logic gate and at least first and second inputs thereto. The method of the invention includes the steps of: a) shifting verification control data through a shift register; b) selecting the first input of the logic gate by applying a first control signal to the first input of the logic gate in response to the output of the shift register; and c) deselecting the second input of the logic gate in response to the output of the shift register. A particularly novel aspect of the invention is provided in that the step of shifting verification control data through the shift register includes the steps of providing a first control signal (e.g. a logical "0") for selecting an input (or column) of the logic gate and supplying a second control signal (e.g. a logical '1') for deselecting all other inputs of the logic gate. The step of supplying a second control signal for deselecting all other inputs of the logic gate includes the step of supplying plural second control signals, one for n−1 deselected inputs of an n input logic gate.

34 Claims, 3 Drawing Sheets

METHOD AND APPARATUS FOR PROGRAM VERIFICATION OF A FIELD PROGRAMMABLE LOGIC DEVICE

BACKGROUND OF THE INVENTION

1. Field of the Invention

The present invention relates to field programmable logic arrays (FPLAs). More specifically, the present invention relates to circuits for programming and verifying field programmable logic arrays.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Programmable logic arrays (PLAs) provide 'glue logic' for printed circuit boards. Glue logic is the logic required to interface integrated circuits within a board and/or several boards and generally includes a plurality of AND gates, OR gates and input/output I/O buffers. PLAs consume less space and therefore generally provide glue logic in a less costly manner than individual AND gates, OR gates and I/O buffers.

PLAs also offer the advantage of user configurability or programmability over discrete or individual gates. That is, PLAs generally include an array of 'AND' gates, an array of 'OR' gates, and some provision for interconnecting the outputs of selected AND gates to the inputs of selected OR gates. PLAs allow a wide variety of logic functions to be implemented through the combination, via the OR gates, of the product terms, provided by the AND gates. Further, the configuration of the field programmable logic arrays FPLAs (and programmable array logic circuits such as the PAL devices manufactured by Advanced Micro Devices of Sunnyvale, Calif.) may be quickly, easily and relatively inexpensively reprogrammed by the user to implement other functions. See U.S. Pat. No. 4,124,899.

Programming of the array is typically performed in a fixture which provides proper programming voltage levels to the integrated cell to allow the cells to be programmed (e.g. electrically erasable or EECELLS) providing the AND functions. Nonetheless, the programming signals must be maintained at appropriate levels for a minimum period of time. After each cell is programmed, the entire array must be verified. This is time consuming given the large number of cells in current arrays. In addition, there are other shortcomings associated with the current approaches for programming and verifying the array of an FPLA.

One approach involves the use of a binary addressing scheme by which the array cells are addressed and programmed as if the array were a memory. Unfortunately, this approach is difficult to implement in that it requires the routing of many additional control signals throughout the chip, since the chip is not organized to perform as a memory in the normal operating mode.

A second approach involves the use of a shift register. With this approach, programming data is serially shifted into the loaded register, loaded in parallel into the array, back into the shift register and serially shifted out of the shift register for verification. That is, during verification, the sense amplifiers data is loaded into the shift register. (Sense amplifiers detect state changes in the array and output product terms therefrom.) This requires the shift registers to be located close to the sense amplifiers in a crowded area on the die. This approach is slow and imposes awkward chip layout requirements on the designer.

Thus, there is a need in the art to reduce the time required to program and verify field programmable logic arrays. In addition, as the logical components must be integrated with programming components, on a chip of limited die area, there is a further need in the art to simplify the layout and die space requirements of FPLAs.

SUMMARY OF THE INVENTION

The need in the art is addressed by the program verification circuit of the present invention. The invention is adapted for use with a programmable logic array having at least one logic gate with first and second inputs thereto. In a most general sense, the program verification circuit of the present invention includes a shift register circuit for latching data and a first multiplexer circuit for applying a first control signal to at least one of the inputs to the logic gate in response to the output of the shift register circuit.

In more specific embodiments, the shift register circuit includes circuitry for latching programming data in a first mode of operation and circuitry for latching verification control data in a second mode of operation. The first multiplexer circuit includes programming control circuitry for applying the output of the shift register circuit to at least one of the inputs to the logic gate in the first mode of operation in response to a first programming control signal. The first multiplexer circuit also includes verification control circuitry for applying the first control signal to at least one of the inputs of the logic gate in response to the output of the shift register circuit in the second mode of operation in response to a first verification control signal.

The circuit for latching programming data in a first mode of operation and latching of verification control data in a second mode of operation includes a second multiplexer circuit connected to the output of the shift register circuit. The second multiplexer circuit is for gating the programming data in the first mode of operation and for providing at least some of the control signals in the second mode of operation in response to a second verification control signal.

Thus, a unique and novel method is provided for verifying the programmed data of a field programmable logic array, having a logic gate with at least first and second inputs thereto. The method of the invention includes the steps of: a) shifting verification control data through a shift register; (b) selecting the first input of the logic gate by applying a first control signal to the first input of the logic gate in response to the output of the shift register; and (c) deselecting the second input of the logic gate in response to the output of the shift register. A particularly novel aspect of the invention is provided in that the step of shifting verification control data through the shift register includes the steps of providing a first control signal (e.g. a logical "0") for selecting an input (or column) of the logic gate and supplying a second control signal (e.g. a logical '1') for deselecting all other inputs of the logic gate. The step of supplying a second control signal for deselecting all other inputs of the logic gate includes the step of supplying plural second control signals, one for n−1 deselected inputs of an n input logic gate.

DESCRIPTION OF THE INVENTION

Illustrative embodiments and exemplary applications will now be described with reference to the accompanying drawings to disclose the advantageous teachings of the present invention.

Figure 1:
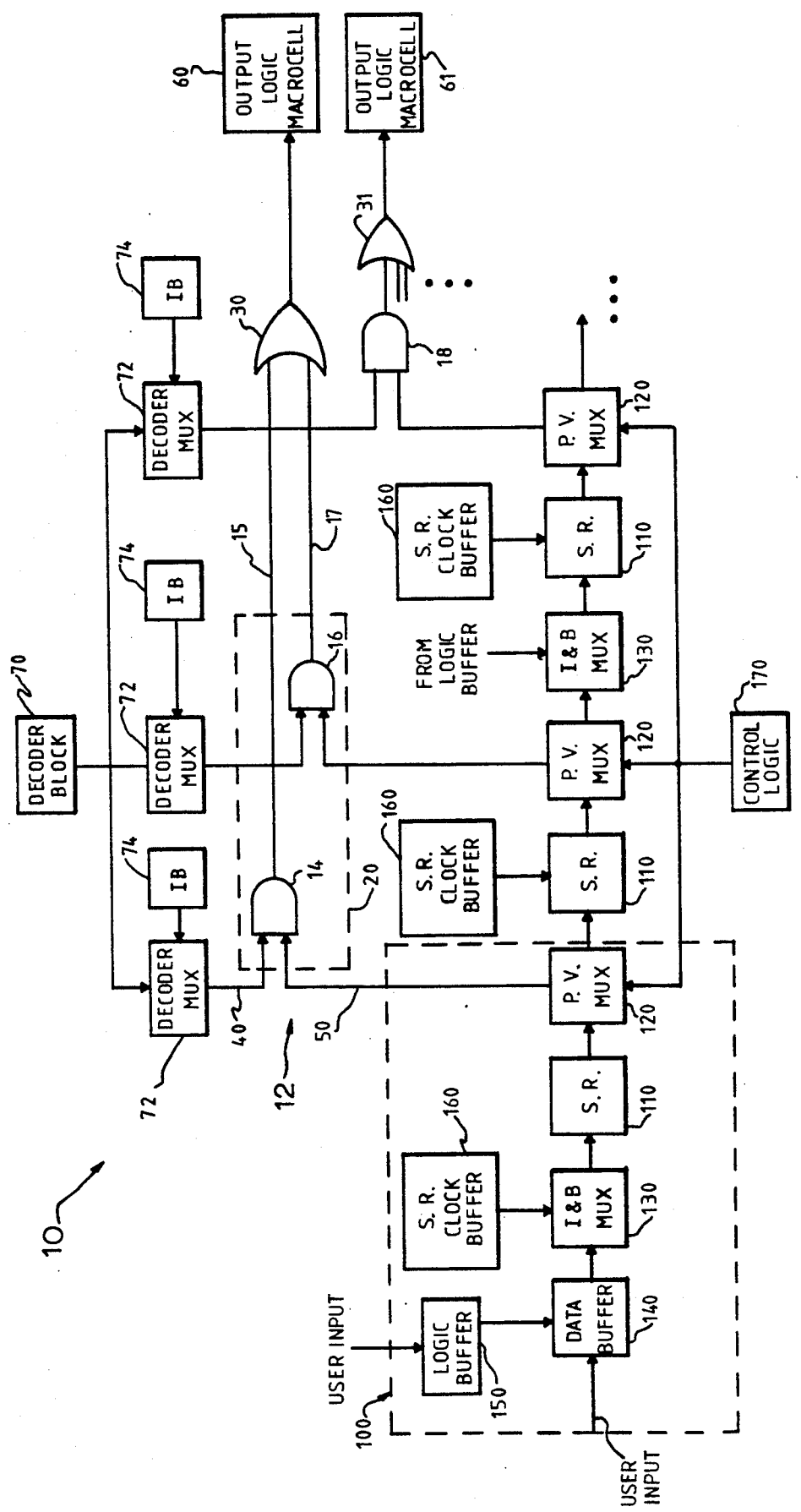
FIG. 1 is a simplified block diagram of a field programmable logic array constructed in accordance with the present teachings.

FIG. 1 is a simplified block diagram of a field programmable logic array 10 constructed in accordance with the present teachings. As is known in the art, the PLA includes a programmable array 12 of programmable cells making up logical AND gates 14, 16, 18 and etc., grouped in macrocells 20-29 of which only the first macrocell 20 is shown in FIG. 1.

Figure 2:
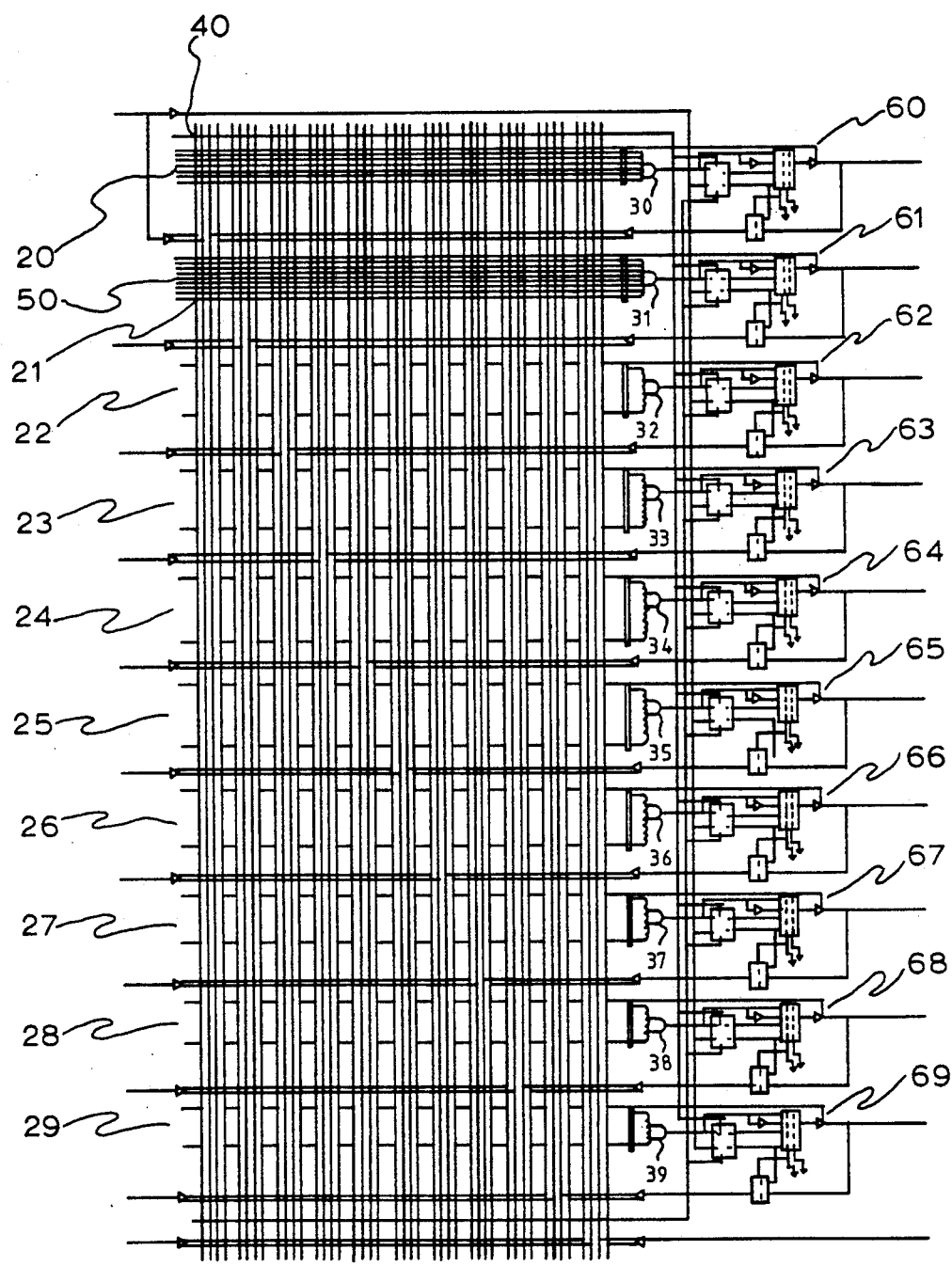
FIG. 2 is a more detailed simplified representation of a typical PLA.

FIG. 2 is a more detailed simplified representation a typical PLA. As shown in FIG. 2, the AND cells actually represent the function achieved by the programmable fusing of the line of a selected row 40 with the line of a selected column 50 of a macrocell. Thus, a logic AND function is performed by the column lines 50 and the input to each cell 14, 15 etc. is provided by the row lines 50. Each output (e.g. 15 and 17) of each AND cell (e.g. 14 and 16, respectively) of each macrocell (e.g. 20) is input to an OR gate 30-39 associated with the macrocell 20-29 respectively. As is conventional in the art, the OR gates 30-39 output to logic macrocells 60-69 respectively.

Returning to FIG. 1, in the programming and verifying modes of operation, the AND cells are addressed by a decoder 70 through a decoder multiplexer 72. The decoder 70 may be implemented with conventional addressing logic. One decoder multiplexer 72 is associated with each AND cell. The decoder multiplexer 72 multiplexes decoder select signals and input data terms supplied from input buffers 74 on the PLA chip in a conventional manner. Hence, in the program and verify modes, the decoder 70 selects a specific row while a program verification circuit selects a specific column 50. The present invention provides an improved program verification circuit 100 for this purpose.

As discussed more fully below, the circuit 100 of the invention is adapted for use with a programmable logic array having at least one logic gate 30 having first and second inputs 15 and 17 thereto. In a most general sense, the program verification circuit 100 of the present invention includes a shift register circuit 110 for latching data and a first multiplexer circuit (denoted a "program and verify multiplexer") 120 for applying a first control signal to at least one of the inputs (e.g., 15) to the logic gate 30, via a column 50 into an AND cell 14, in response to the output of the shift register circuit 110.

In more specific embodiments, the shift register circuit 110 includes circuitry for latching programming data in a first mode of operation and circuitry for latching verification control data in a second mode of operation. The program and verify multiplexer 120 includes programming control circuitry for applying the output of the shift register circuit 110 to at least one of the inputs (e.g., 15) to the logic gate 30, via a column 50 and an AND cell 14, for example, in the first mode of operation in response to a first programming control signal. The program and verify multiplexer 120 also includes verification control circuitry for applying a first control signal to at least one of the inputs 15 of the logic gate 30, via a column 50 an AND gate output 14, for example, through the shift register circuit in the second mode of operation in response to a first verification control signal.

The circuit for latching programming data in a first mode of operation and latching verification control data in a second mode of operation includes a second multiplexer circuit 130 connected to the input of a shift register circuit 110. The second multiplexer circuit 130 gates programming data in the first mode of operation and provides at least some of the control signals in the second mode of operation in response to a second verification control signal. User inputs are provided to the second multiplexer (hereinafter the "isolation and backfill" multiplexer) 130 via a data buffer 140 and a logic buffer 150. As depicted in FIG. 1, the shift register 110 is driven by a conventional shift register clock buffer 160.

Figure 3:
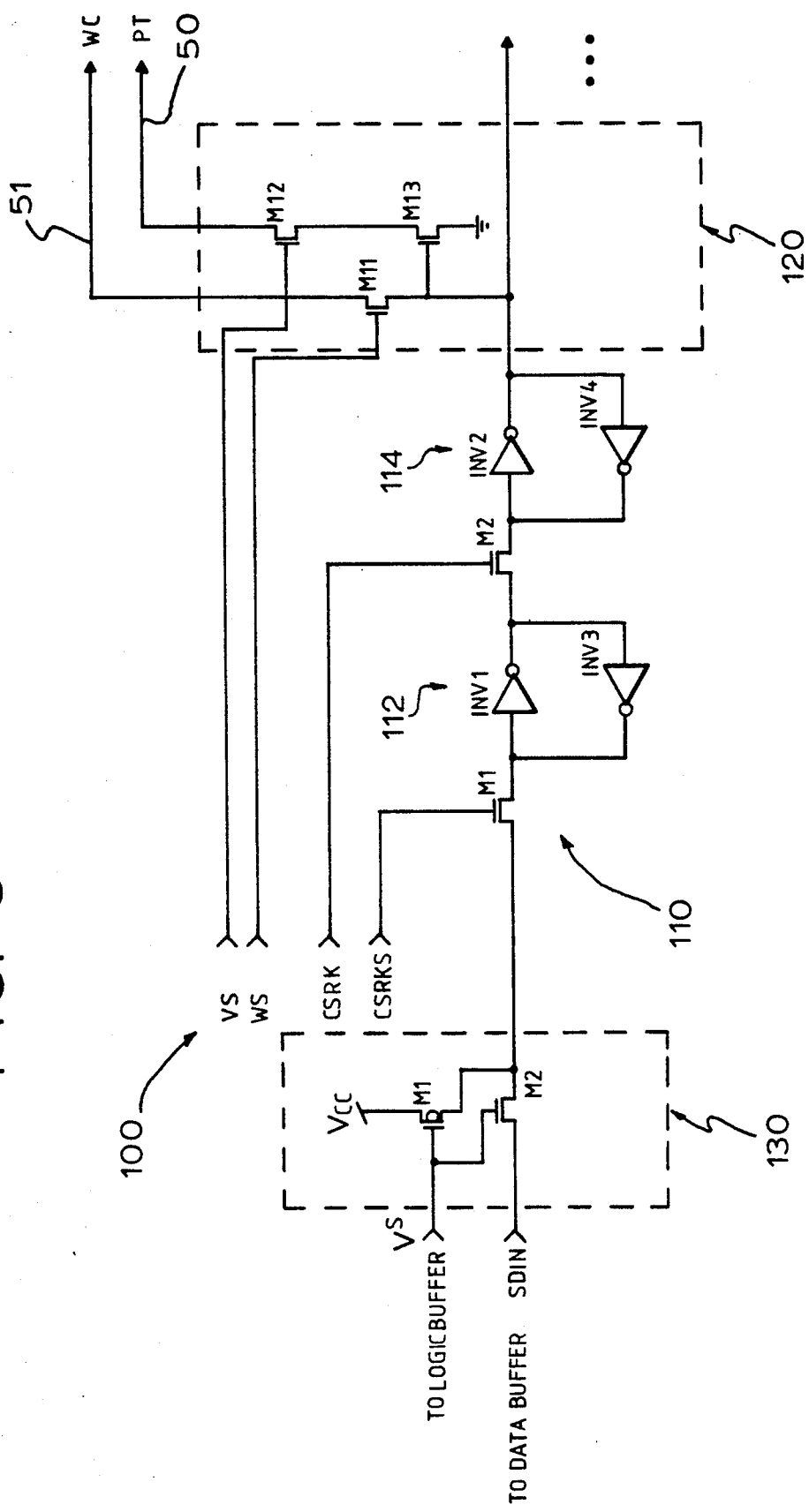
FIG. 3 is a schematic diagram of the program verification circuit of the present invention.

FIG. 3 is a schematic diagram of the improved program verification circuit 100 of the present invention. The shift register 110 is of conventional design and includes two latches 112 and 114 formed by inverter pairs INV1 and INV3 and INV2 and INV4 respectively. Each latch 112 and 114 is preceded by an isolation transistor M1 and M2 respectively. In the illustrative embodiment of FIG. 3, the isolation transistors M1 and M2 are implemented with n-channel complementary metal-oxide semiconductor (CMOS) transistors. The source and drain terminals of the isolation transistors M1 and M2 are in-line with the latches 112 and 114. The gate terminals of the isolation transistors M1 and M2 are connected to complementary outputs "CSRKB" and "CSRK", respectively, of the shift register clock buffer 160.

The program and verify multiplexer 120 is implemented with three CMOS transistors M11, M12 and M13. The drain terminal of the first transistor M11 is connected to the output of the shift register 110. The gate of the first transistor M11 is connected to internal control logic 170 (shown in FIG. 1 only) on the PLA chip. The internal control logic 170 on the chip provides a "write select" (WS) on this line effective in the program mode of operation. The source of the first transistor M11 is connected to a "write control" (WC) line 51 and is the program path signal for putting program data into the associated cell of the array 12.

The source terminal of the second transistor M12 of the program and verify multiplexer 120 is connected to the array 12 via a column line. This line, also referred to as a product term (PT) line is connected to the array cells and forms the logical AND gate. The drain terminal of the second transistor M12 of the program and verify multiplexer 120 is connected to the source terminal of the third transistor M13. The gate terminal of the second transistor is connected to the internal control logic on the PLA array. The internal control logic 170 provides a "verify select" (VS) signal on this line effective in the verify mode of operation.

The gate terminal of the third transistor M13 is connected to the output of the shift register 110. The drain terminal of the third transistor M13 is connected to ground.

The isolation and backfill multiplexer 130 is implemented with two CMOS transistors M1 and M2. In the illustrative embodiment, the first transistor M1 of the isolation and backfill multiplexer 130 is a p-channel transistor and the second transistor M2 is an n-channel transistor. The gates of the first and second transistors M1 and M2 of the isolation and backfill multiplexer 130 are connected to a single line from the logic buffer 150. (The logic buffer provides a V' control signal which serves as a second verification control signal. The second verification control signal VS' is complementary to the first verification control signal (VS).) Thus, the first and transistors M1 and M2 operate in a complementary manner. The source of the first transistor M1 is connected to a source of supply $V_{cc}$ and the drain terminal thereof is connected to the input of a shift register 110.

The source of the second terminal of the isolation and backfill multiplexer 130 is connected to a data buffer 140, or shift register 110 output while the drain terminal thereof is connected to the input of the shift register 110.

As illustrated in FIG. 1, one shift register 110 and one program and verify multiplexer 120 are provided for each cell 14, 16, etc. in the array 12. The output of each shift register is connected to the input of the next shift register. One isolation and backfill multiplexer 130 is provided for a group of shift registers 110 at the beginning of the chain of shift registers in each macrocell 20, 21, etc. Thus, one continuous chain of columns and macrocells are provided by the arrangement of the present invention. This, an input to the first shift register will ultimately propagate through the last shift register in the last macrocell.

In the first mode of operation, the program mode, the write select signal (WS) from the control logic 170 goes high and the verify select (VS) signal is low. Thus, the first transistor M11 of each program and verify multiplexer 120 is on and second transistor M12 is off. Hence, the output of each shift register 110 is connected to the write control line 51 of each cell 14, 16, etc. in the array 12. Meanwhile, the VS' signal from the logic buffer 150 is also high. Thus, the first transistor M1 of the isolation and backfill multiplexer 130 is off and the second transistor M2 is on. Hence, program data from the user is input through the data buffer 140 and the second transistor of the isolation and backfill multiplexer 130 to the shift register 110. Programming data is clocked through shift register 110 by signals from the shift register clock buffer 160 to the appropriate column line 51 for programming the cell of a selected row in the array 12. Row selection is performed by the decoder block 70. The cells in the array 12 are then programmed in a conventional manner.

Following a programming cycle, it is necessary to verify successful programming. In the second, verify, mode of operation, the same shift registers 110, used for programming, are used in conjunction with the program verify multiplexer 120 to perform a Y-decode function. Y-decoding deselects n−1 columns in each output macro, where n= number of columns in the macrocell. Deselection of n−1 columns is needed to observe at macrocell outputs 60-69 one column at a time within each macrocell. The verify path contains a logical OR gate 30 of the PLA 10 that without deselection would prevent independent verification of each column. Hence, in this mode, the circuit 100 is initialized with a logical "0" in the first shift register 110 of each macrocell and a logical "1" in the remaining shift registers of each macrocell. Next, the write select (WS) and the second verify (VS') signals go low while the verify select signal (VS) is high. The gate terminal of the third transistor M13 of the program and verify multiplexers 120 of the columns 50 having a "0" in the shift register 110, is low and therefore the transistor M13 is off and that column is selected for input to the OR gate 30, 31 or etc. The gate terminals of the third transistors M13 of the program and verify multiplexers 120 of the columns 50 having a "1" in the shift register 110, is high and therefore the transistor M13 is on and those columns are connected to ground, pulled low, and therefore deselected for input to the OR gates 30, 31 and etc. The n−1 low columns permit each OR gate to remain active for the selected column. With the decoder block 70 selecting the appropriate row (e.g., 40), the program of each cell may be independently verified at the output of the PLA 10.

In the verify mode of operation, the isolation and backfill multiplexer 130 serves to speed verification of devices with a variable number of columns or product terms per output macrocell as illustrated in FIG. 2. With macrocells of different sizes, without the isolation and backfill multiplexer 130, a select signal, in this case, a logical "0", may be transferred from a first macrocell to a second macrocell before the original select signal, logical "0", has been shifted through the second macrocell. This is prevented by the isolation transistor M2 of the isolation and backfill multiplexer 130. When VS' is low, M2 is off and thus each macrocell is isolated from the adjacent macrocells. In addition, as the select signal, logical "0", is shifted through each column 50 of the macrocell, deselect signals, logical "1"'s must be shifted in, or backfilled, behind the select signal to assure that only one column is selected at a time. This function is also performed by the isolation and backfill multiplexer 130. When the second verification control signal VS' is low, the first transistor M1 of the isolation and backfill multiplexer 130 is on. Thus, during each shift register clock cycle, a "1" is shifted into the register 110 from the voltage source $V_{cc}$ through the channel of M1. This isolation and backfilling speeds testing and programmer verification by eliminating the need to reload the shift register after the macrocell with the least number of columns is verified.

In short, a unique and novel method of verifying the program of a field programmable logic array is afforded by the present invention which is adapted for use with a PLA having a logic gate with at least first and second inputs thereto. The method of the invention includes the steps of: (a) latching programming data into plural shift registers, in a first mode of operation, one for each input to the logic gate; (b) applying a control signal to each of the inputs to the logic gate in response to the output of an associated shift register by applying the output of the associated shift register to at least one of the inputs to the logic gate in response to a first programming control signal; and (c) gating the programming data into the shift register in the first mode of operation.

Thus, the present invention has been described herein with reference to a particular embodiment for a particular application. Those having ordinary skill in the art and access to the present teachings will recognize additional modifications applications and embodiments within the scope thereof. For example, the invention is not limited to implementation in either positive or negative logic. Nor is the invention limited to the use of field effect transistors. Any suitable switching element may be used in place of the transistors in the illustrative embodiments without departing from the scope of the present teachings.

It is therefore intended by the appended claims to cover any and all such applications, modifications and embodiments within the scope of the present invention.

Accordingly, What is claimed is:

1. A program verification circuit for a programmable logic array having at least one logic gate and first and second inputs thereto, said program verification circuit comprising:
   shift register means for latching data, said shift register means including means for latching programming data in a first mode of operation and means for latching programming control data in a second mode of operation; and
   first multiplexer means for applying a first control signal to at least one of said inputs to said logic gate in response to the output of said shift register means, said first multiplexer means including verification control means for applying said first control signal to at least one of said inputs in response to the output of said shift register means in said second mode of operation in response to a first verification control signal.

2. The invention of claim 1 wherein said first multiplexer means includes programming control means for applying the output of said shift register means to at least one of said inputs to said logic gate in said first mode of operation in response to a first programming control signal.

3. The invention of claim 2 wherein said programming control means includes a first transistor having a first terminal connected to the output of said shift register, a second terminal connected to a source of said first verification control signal, and a third terminal connected to said input of said logic gate, said second terminal being the control terminal thereof.

4. The invention of claim 3 wherein said first transistor of said first multiplexer means is a complementary metal-oxide transistor.

5. The invention of claim 4 wherein said first transistor of said first multiplexer means is an n-channel complementary metal-oxide semiconductor transistor.

6. The invention of claim 3 wherein said verification control means includes second and third transistors, said third transistor having a first terminal connected to a first source of potential, a second terminal connected to the output of said shift register, and a third terminal connected to a first terminal of said second transistor, and said second transistor having a second terminal connected to a source of said first program control signal, and a third terminal connected to said input of said logic gate.

7. The invention of claim 6 wherein said second and third transistors of said first multiplexer means are complementary metal-oxide semiconductor transistors.

8. The invention of claim 7 wherein said second and third transistors of said first multiplexer means are n-channel complementary metal-oxide semiconductor transistors and said first source of potential is ground potential.

9. The invention of claim 1 wherein said means for latching programming data in a first mode of operation and said means for latching verification control data in a second mode of operation includes second multiplexer means connected to the input of said shift register means for gating said programming data in said first mode of operation and for providing at least some of said control signals in said second mode of operation in response to a second verification control signal.

10. The invention of claim 9 wherein said second multiplexer means includes a first transistor having a first terminal connected to a source of program data signals, a second terminal connected to the input of said shift register and a third terminal connected to a source of said second verification control signal, said second terminal being the control terminal thereof.

11. The invention of claim 10 wherein said second multiplexer means includes a second transistor having a first terminal connected to a source of potential, a second terminal connected to said source of said second verification control signal, and a third terminal connected to said input of said shift register.

12. The invention of claim 11 wherein said first transistor of said second multiplexer means is a complementary metal-oxide semiconductor transistor.

13. The invention of claim 12 wherein said second transistor of said second multiplexer means is a complementary metal-oxide semiconductor transistor.

14. The invention of claim 13 wherein said first transistor of said second multiplexer means is an n-channel complementary metal-oxide semiconductor transistor.

15. The invention of claim 14 wherein said second transistor of said second multiplexer means is a p-channel complementary metal-oxide semiconductor transistor.

16. The invention of claim 15 wherein said source of potential is not ground potential.

17. A program verification circuit for a programmable logic array having at least one logic gate and first and second inputs thereto, said program verification circuit comprising:
   shift register means including plural shift registers, one for each input to said logic gate, for latching programming data in a first mode of operation and for latching verification control data in a second mode of operation;
   first multiplexer means, including one multiplexer for each associated shift register, for applying a first control signal to one of said inputs to said logic gate in response to the output of an associated shift register, said first multiplexer means including:
   verification control means for applying said first control signal to at least one of said inputs in response to the output of said associated shift register in said second mode of operation in response to a first verification control signal and
   programming control means for applying the output of said associated shift register to at least one of said inputs to said logic gate in said first mode of operation in response to a first programming control signal; and
   second multiplexer means connected to the input of said shift register means for gating said programming data in said first mode of operation and for providing at least some of said control signals in said second mode of operation in response to a second verification control signal.

18. The invention of claim 17 wherein said verification control means includes a first transistor having a first terminal connected to the output of said shift register, a second terminal connected to a source of said first verification control signal, and a third terminal connected to said input of said logic gate, said second terminal being the control terminal thereof.

19. The invention of claim 18 wherein said first transistor of said first multiplexer means is a complementary metal-oxide semiconductor transistor.

20. The invention of claim 19 wherein said first transistor of said first multiplexer means is an n-channel complementary metal-oxide semiconductor transistor.

21. The invention of claim 18 wherein said programming control means includes second and third transistors, said third transistor having a first terminal connected to a first source of potential, a second terminal connected to the output of said shift register, and a third terminal connected to a first terminal of said second transistor, and said second transistor having a second terminal connected to a source of said first program control signal, and a third terminal connected to said input of said logic gate.

22. The invention of claim 21 wherein said second and third transistors of said first multiplexer means are complementary metal-oxide semiconductor transistors.

23. The invention of claim 22 wherein said second and third transistors of said first multiplexer means are n-channel complementary metal-oxide semiconductor transistors and said first source of potential is ground potential.

24. The invention of claim 17 wherein said second multiplexer means includes a first transistor having a first terminal connected to a source of program data signals, a second terminal connected to the input of said shift register and a third terminal connected to a source of said second verification control signal, said second terminal being the control terminal thereof.

25. The invention of claim 24 wherein said second multiplexer means includes a second transistor having a first terminal connected to a source of potential, a second terminal connected to said source of said second verification control signal, and a third terminal connected to said input of said shift register.

26. The invention of claim 25 wherein said first transistor of said second multiplexer means is a complementary metal-oxide semiconductor transistor.

27. The invention of claim 26 wherein said second transistor of said second multiplexer means is a complementary metal-oxide semiconductor transistor.

28. The invention of claim 27 wherein said first transistor of said second multiplexer means is an n-channel complementary metal-oxide semiconductor transistor.

29. The invention of claim 28 wherein said second transistor of said second multiplexer means is a p-channel complementary metal-oxide semiconductor transistor.

30. The invention of claim 29 wherein said source of potential is not ground potential.

31. A method of verifying the program of a field programmable logic array having a logic gate and at least first and second inputs thereto, including the steps of:
 (a) shifting verification control data through a shift register;
 (b) selecting said first input of said logic gate by applying a first control signal to said first input of said logic gate in response to the output of said shift register; and
 (c) deselecting said second input of said logic gate in response to said output of said shift register.

32. The invention of claim 31 wherein said step of shifting verification control data through said shift register includes the steps of providing a first control signal for selecting an input of said logic gate and supplying a second control signal for deselecting all other inputs of said logic gate.

33. The invention of claim 32 wherein said step of supplying a second control signal for deselecting all other inputs of said logic gate includes the step of supplying plural second control signals, one for n−1 deselected inputs of an n input logic gate.

34. A method of inputting and verifying a program in a field programmable logic array having a logic gate and at least first and second inputs thereto, said method including the steps of:
 (a) latching programming data into plural shift registers, in a first mode of operation, one for each input to said logic gate;
 (b) applying a control signal to each of said inputs to said logic gate in response to the output of an associated shift register by applying the output of said associated shift register to at least one of said inputs to said logic gate in response to a first programming control signal;
 (c) gating said programming data into said shift register in said first mode of operation;
 (d) latching verification control data into said shift registers, in a second mode of operation;
 (e) applying said first control signal to at least one of said inputs in response to the output of said associated shift register in said second mode of operation in response to a first verification control signal; and
 (f) gating at least some of said control signals in said second mode of operation in response to a second verification control signal.

* * * * *